(12) United States Patent
Morimoto et al.

(10) Patent No.: US 11,652,019 B2
(45) Date of Patent: May 16, 2023

(54) HEAT DISSIPATION STRUCTURE

(71) Applicant: Yazaki Corporation, Tokyo (JP)

(72) Inventors: Mitsuaki Morimoto, Shizuoka (JP);
Kazuo Sugimura, Shizuoka (JP);
Kazuya Tsubaki, Shizuoka (JP);
Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 272 days.

(21) Appl. No.: 16/858,783

(22) Filed: Apr. 27, 2020

(65) Prior Publication Data
US 2020/0381329 A1    Dec. 3, 2020

(30) Foreign Application Priority Data
May 28, 2019 (JP) ............................. JP2019-099100

(51) Int. Cl.
*H01L 23/367* (2006.01)
*F28F 13/00* (2006.01)

(52) U.S. Cl.
CPC .......... *H01L 23/3672* (2013.01); *F28F 13/00* (2013.01); *H01L 23/3675* (2013.01); *F28F 2215/08* (2013.01)

(58) Field of Classification Search
CPC ... H01L 23/3672; H01L 23/3675; F28F 13/00
See application file for complete search history.

(56) References Cited

U.S. PATENT DOCUMENTS

| | | | | |
|---|---|---|---|---|
| 6,191,480 B1* | 2/2001 | Kastberg | .............. | H05K 7/1061 257/692 |
| 6,198,630 B1* | 3/2001 | Cromwell | ............ | H05K 7/1431 174/16.3 |
| 6,731,506 B1* | 5/2004 | Dong | .................. | H01L 23/4093 24/458 |
| 6,791,847 B2* | 9/2004 | Ma | ...................... | H01L 23/4093 174/548 |
| 6,969,267 B2* | 11/2005 | Byquist | ................ | H05K 7/1007 439/73 |
| 7,042,723 B2* | 5/2006 | Espersen | ............... | H01L 23/473 174/15.1 |

(Continued)

FOREIGN PATENT DOCUMENTS

| | | |
|---|---|---|
| DE | 11 2018 002 707 T5 | 2/2020 |
| JP | H11-202979 A | 7/1999 |

(Continued)

*Primary Examiner* — Eugene Lee
(74) *Attorney, Agent, or Firm* — Kenealy Vaidya LLP (57) ABSTRACT

A heat dissipation structure includes a heat dissipation portion and a heat storage portion. The heat dissipation portion has the heat receiving surface including the contact surface in contact with the semiconductor generating the heat, and dissipates the heat of the semiconductor in contact with the contact surface. The heat storage portion is arranged to sandwich the semiconductor. The heat storage portion has, for example, the heat storage opening portion in which the semiconductor is positioned, and surrounds the semiconductor. The heat storage portion is provided to he in contact with the heat receiving surface, and stores the heat of the semiconductor conducted through the heat dissipation portion.

4 Claims, 6 Drawing Sheets

(56) References Cited

U.S. PATENT DOCUMENTS

| | | | | |
|---|---|---|---|---|
| 8,064,739 B2* | 11/2011 | Binkert | ............ | G02B 6/43 |
| | | | | 385/14 |
| 8,542,488 B2* | 9/2013 | Peterson | ............ | H01L 23/4006 |
| | | | | 361/699 |
| 9,076,754 B2* | 7/2015 | Hung | ............ | H01L 25/0657 |
| 9,089,051 B2* | 7/2015 | Li | ............ | H01L 23/433 |
| 9,136,202 B2* | 9/2015 | Chiriac | ............ | H01L 23/4275 |
| 9,918,407 B2* | 3/2018 | Rosales | ............ | H05K 7/20509 |
| 2008/0174968 A1* | 7/2008 | Feng | ............ | H01L 23/4093 |
| | | | | 361/720 |
| 2011/0147916 A1* | 6/2011 | Su | ............ | H01L 23/433 |
| | | | | 257/692 |
| 2014/0061893 A1* | 3/2014 | Saeidi | ............ | H01L 23/562 |
| | | | | 438/122 |
| 2017/0092561 A1* | 3/2017 | Eid | ............ | H01L 21/4878 |
| 2017/0345736 A1* | 11/2017 | Miyairi | ............ | H01L 23/3672 |
| 2018/0277396 A1* | 9/2018 | Colgan | ............ | H01L 23/473 |
| 2018/0374714 A1* | 12/2018 | Stathakis | ............ | H01L 23/42 |
| 2019/0348406 A1* | 11/2019 | Nakano | ............ | H01L 25/50 |
| 2020/0098660 A1 | 3/2020 | Wakaiki et al. | | |
| 2020/0286806 A1* | 9/2020 | Nofen | ............ | F28F 21/089 |

FOREIGN PATENT DOCUMENTS

| | | |
|---|---|---|
| JP | 2003-142864 A | 5/2003 |
| JP | 2005-93848 A | 4/2005 |
| JP | 2010-267912 A | 11/2010 |

* cited by examiner

HEAT DISSIPATION STRUCTURE

CROSS-REFERENCE TO RELATED APPLICATION (S)

The present application claims priority to and incorporates by reference the entire contents of Japanese Patent Application No. 2019-099100 filed in Japan on May 28, 2019.

BACKGROUND OF THE INVENTION

1. Field of the Invention

The present invention relates to a heat dissipation structure.

2. Description of the Related Art

Conventionally, as a heat dissipation structure, for example, Japanese Patent Application Laid-open No. 2005-93848 discloses a cooling device including a cooling body that dissipates heat conducted from a heating element. Miniaturization of the cooling body has been realized by embedding a heat storage body in a body of the cooling body.

However, in the cooling device described in Japanese Patent Application Laid-open No. 2005-93848, for example, the heat storage body has a thermal conductivity lower than that of the body of the cooling body, and the thermal conductivity of the body of the cooling body is thus deteriorated due to the heat storage body embedded in the body of the cooling body, such that there is a possibility that performance of the cooling body will be deteriorated.

SUMMARY OF THE INVENTION

Therefore, the present invention has been made in view of the above, and an object of the present invention is to provide a heat dissipation structure capable of appropriately dissipating heat.

In order to solve the above mentioned problem and achieve the object, a heat dissipation structure according to one aspect of the present invention includes a heat dissipation portion that has a heat receiving surface including a contact surface in contact with an electronic component generating heat and dissipates the heat of the electronic component in contact with the contact surface; and a heat storage portion that is arranged to sandwich the electronic component, is provided to be in contact with the heat receiving surface, and stores the heat of the electronic component conducted through the heat dissipation portion.

According to another aspect of the present invention, in the heat dissipation structure, it is preferable that the heat dissipation structure includes a heat conductive member that is provided between the electronic component and the heat storage portion, and the heat receiving surface.

According to still another aspect of the present invention, in the heat dissipation structure, it is preferable that the heat dissipation structure includes a housing that accommodates the heat storage portion and the electronic component, wherein the heat storage portion has a heat storage opening portion in which the electronic component is positioned and surrounds the electronic component, the heat storage portion is assembled from one side in an axial direction of the heat storage opening portion to the housing and the electronic component is assembled from the other side in the axial direction to the housing, and the housing includes a housing opening portion which is positioned inside the heat storage opening portion in the axial direction and into which the electronic component is inserted.

In order to achieve the object, a heat dissipation structure according to still another aspect of the present invention includes a heat dissipation portion that is provided to be spaced apart from an electronic component generating heat and dissipates the heat generated by the electronic component; a heat conductive member that connects the electronic component and the heat dissipation portion to each other and conducts the heat generated by the electronic component to the heat dissipation portion; and a heat storage portion that is provided on any one of a side adjacent to the heat dissipation portion and a side adjacent to the electronic component and stores the heat generated by the electronic component.

According to still another aspect of the present invention, in the heat dissipation structure, it is preferable that the heat storage portion is provided on the side adjacent to the heat dissipation portion, and is positioned to face the heat dissipation portion through the heat conductive member.

According to still another aspect of the present invention, in the heat dissipation structure, it is preferable that the heat storage portion is provided on the side adjacent to the electronic component, and is positioned to be in contact with the electronic component.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Modes (embodiments) for carrying out the present invention will be described in detail with reference to the drawings. The present invention is not limited by contents described in the following embodiments. In addition, components described below include components that can be easily assumed by those skilled in the art and components that are substantially the same as each other. Furthermore, structures described below can be appropriately combined with each other. In addition, various omissions, substitutions, or changes of the configuration can be made without departing from the scope of the present invention.

First Embodiment

Figure 1:
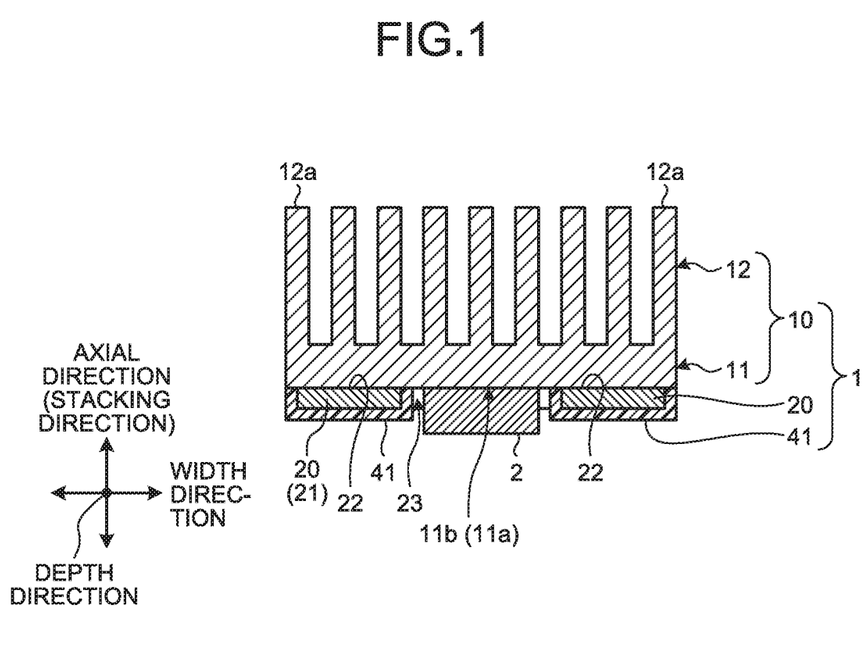
FIG. 1 is a cross-sectional view illustrating a configuration example of a heat dissipation structure according to a first embodiment.

A heat dissipation structure 1 according to an embodiment will be described with reference to the drawings. FIG. 1 is a cross-sectional view illustrating a configuration example of a heat dissipation structure 1 according to a first embodiment. The heat dissipation structure 1 dissipates heat generated from a semiconductor 2 as an electronic component. The heat dissipation structure 1 includes, for example, a heat dissipation portion 10, a heat storage portion 20, and a case 41, as illustrated in FIG. 1.

Here, in the following description, a direction along an axis of a heat storage opening portion 23 described later is referred to as an axial direction. The axial direction is the same as a stacking direction in which the heat dissipation portion 10 and the heat storage portion 20 are stacked. A width direction is a direction along a direction in which a plurality of projections 12a of a heat dissipation fin 12 described later are arranged. A depth direction is a direction orthogonal to the axial direction and the width direction.

The heat dissipation portion 10 dissipates the heat of the semiconductor 2. The heat dissipation portion 10 is formed of a metal such as copper or aluminum. The heat dissipation portion 10 includes a heat sink 11 and the heat dissipation fan 12. The heat sink 11 is formed in a plate shape, and has a heat receiving surface 11a on one side of the heat sink 11 in the stacking direction. The heat receiving surface 11a is formed in a planar shape, and a connection surface of the semiconductor 2 is connected to the heat receiving surface 11a. The heat receiving surface 11a is formed larger than the connection surface of the semiconductor 2, and has a contact surface 11b in contact with the connection surface of the semiconductor 2 at a center portion of the heat receiving surface 11a.

The heat dissipation fin 12 is provided on the heat sink 11 and is formed on an opposite side to the heat receiving surface 11a. The heat dissipation fin 12 is integrally formed with the heat sink 11, and is provided with the plurality of projections 12a. Each of the plurality of projections 12a is formed in a plate shape and is aligned along the width direction. The heat dissipation fin 12 has the plurality of projections 12a to expand a heat transfer area and improve a heat dissipation effect.

The heat storage portion 20 stores heat. The heat storage portion 20 is formed of, for example, a known solid-liquid phase change material or solid heat storage material. The solid-liquid phase change material stores heat when a material is phase-changed (melted) from a solid to a liquid, and dissipates heat when the material is phase-changed (solidified) from a liquid to a solid. The solid heat storage material stores and dissipates heat without being phase-changed. When the solid-liquid phase change material is used as a material of the heat storage portion 20, the heat storage portion 20 is formed by filling a metal case having a good thermal conductivity, such as aluminum whose inner portion is hollow with the solid-liquid phase change material from a filling port, and then sealing the filling port. Alternatively, when the solid-liquid phase change material is used as a material of the heat storage portion 20, a heat storage material may be formed by enclosing the solid-liquid phase change material in a small capsule and mix the small capsule with a resin.

The heat storage portion 20 is formed in a plate shape, and includes a heat storage portion body 21, an abutting surface 22, and a heat storage opening portion 23. The abutting surface 22 is provided on a side of the heat storage portion body 21 facing the heat dissipation portion 10 in the stacking direction, and abuts onto the heat receiving surface 11a of the heat dissipation portion 10. The heat storage opening portion 23 is provided at a center portion of the heat storage portion body 21 and is opened. The heat storage opening portion 23 is formed in, for example, a rectangular shape according to an outer shape of the semiconductor 2. The semiconductor 2 is inserted into the heat storage opening portion 23, and the semiconductor 2 is positioned in the heat storage opening portion 23. The heat storage portion 20 surrounds the semiconductor 2 in a state where the semiconductor 2 is positioned in the heat storage opening portion 23, and has a certain interval from the semiconductor 2 in the width direction and the depth direction. That is, the heat storage portion 20 sandwiches the semiconductor 2 in a state where the semiconductor 2 is positioned in the heat storage opening portion 23, and is in a non-contact state with the semiconductor 2. The heat storage portion 20 is assembled to the heat dissipation portion 10 in a state of being accommodated and held in the case 41. The heat storage portion 20 stores the heat of the semiconductor 2 conducted through the heat dissipation portion 10 by including the abutting surface 22 provided to be in contact with the heat receiving surface 11a of the heat dissipation portion 10. The heat storage portion 20 stores the heat of the semiconductor 2 through the heat dissipation portion 10 when the heat of the semiconductor 2 reaches a heat storage temperature 12 (see FIG. 4) described later, and does not store the heat of the semiconductor 2 when the heat of the semiconductor 2 does not reach the heat storage temperature T2.

The case 41 accommodates the heat storage portion 20. The case 41 is formed of a material such as resin or metal. The case 41 has a first accommodating portion 41a (see FIG. 6) at an inner side thereof. The heat storage portion 20 is accommodated in the first accommodating portion 41a. The case 41 covers an outer peripheral surface of the heat storage portion 20 accommodated in the first accommodating portion 41a except for the abutting surface 22 of the heat storage portion 20. When the case 41 is formed of a metal material, heat can also be transferred from the case 41 to the heat storage portion 20, such that the heat can be efficiently transferred to the heat storage portion 20.

Figure 2:
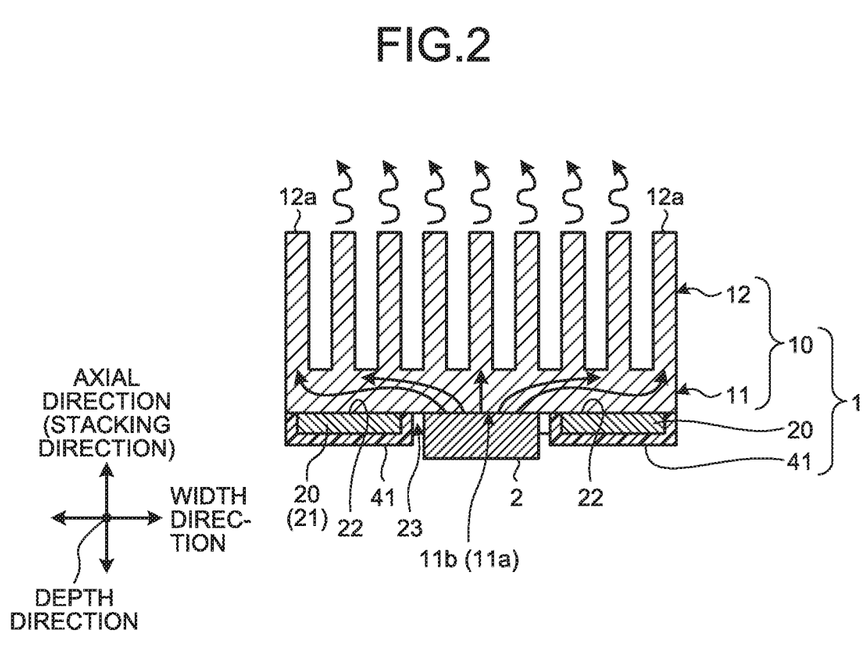
FIG. 2 is a cross-sectional view illustrating a first heat dissipation example of the heat dissipation structure according to the first embodiment.
Figure 3:
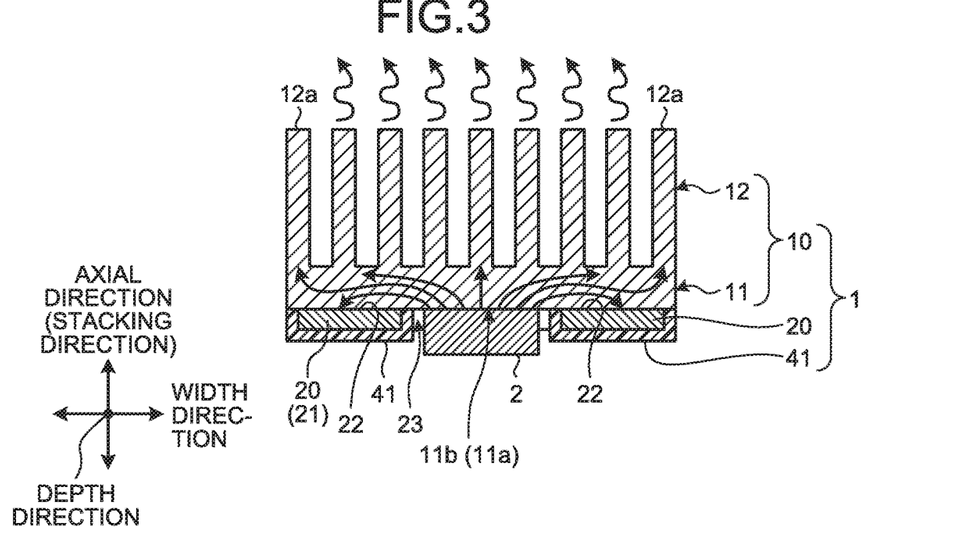
FIG. 3 is a cross-sectional view illustrating a second heat dissipation example of the heat dissipation structure according to the first embodiment.
Figure 4:
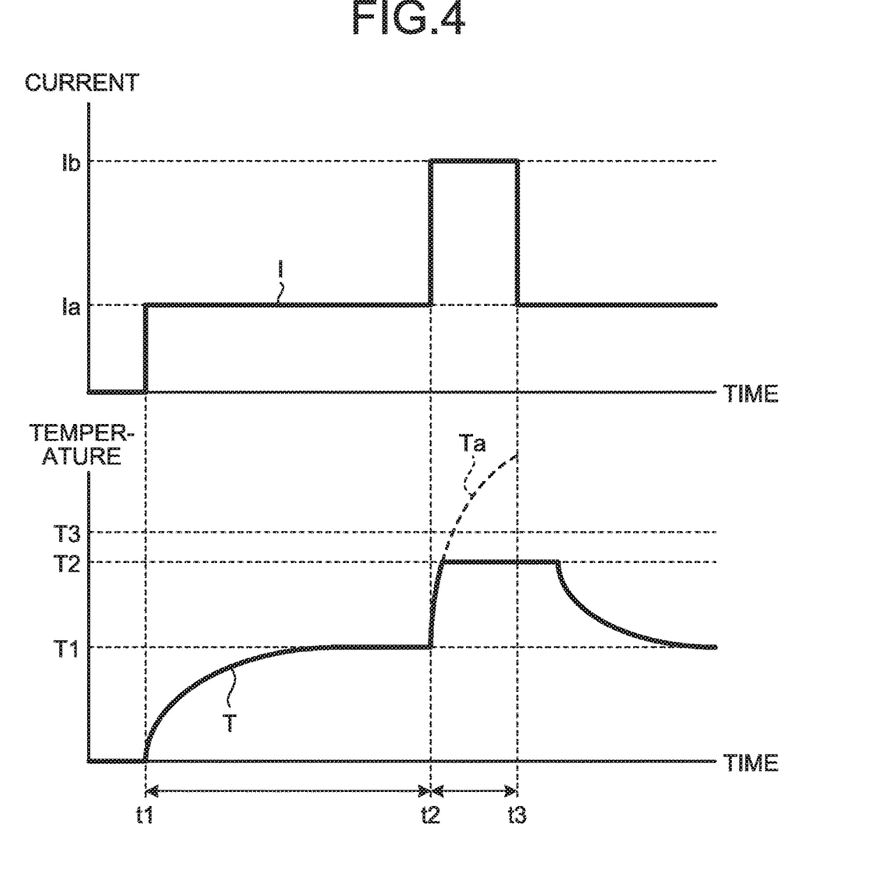
FIG. 4 is a view illustrating a temperature rise example of a semiconductor according to the first embodiment.

Next, a heat dissipation example of the heat dissipation structure 1 will he described. FIG. 2 is a cross-sectional view illustrating a first heat dissipation example of the heat dissipation structure 1 according to the first embodiment. FIG. 3 is a cross-sectional view illustrating a second heat dissipation example of the heat dissipation structure 1 according to the first embodiment. FIG. 4 is a view illustrating a temperature rise example of the semiconductor 2 according to the first embodiment. FIG. 4 illustrates a relationship between a current I flowing to the semiconductor 2 and a temperature T of the semiconductor 2. In FIG. 4, a horizontal axis represents a time, and a vertical axis represents a current or a temperature.

In the heat dissipation structure 1, when a current I having a normal current value Ia flows to the semiconductor 2 between a time t1 and a time t2 as illustrated in FIG. 4, heat of the semiconductor 2 is transferred to the heat dissipation portion 10, and the heat of the semiconductor 2 is dissipated by the heat dissipation portion 10 (see FIG. 2). At this time, a rising temperature T1 of the semiconductor 2 is obtained by the product of power consumption of the semiconductor 2 and a thermal resistance of the heat dissipation portion 10. A heat storage temperature T2 at which the heat storage portion 20 starts to store the heat is set between the rising temperature T1 of the semiconductor 2 when the current I having the normal current value Ia flows to the semiconductor 2 and a failure temperature T3 at which the semiconductor 2 fails, as illustrated in FIG. 4. Thus, when the current I having the normal current value Ia flows to the semiconductor 2, the heat storage portion 20 does not store the heat of the semiconductor 2 because the temperature T of the semiconductor 2 does not reach the heat storage temperature T2.

On the other hand, in the heat dissipation structure 1, when a current I having a large current value Ib flows to the semiconductor 2 between the time t2 and a time t3 as illustrated in FIG. 4, a temperature of the semiconductor 2 rises above the normal rising temperature T1. At this time, a temperature of the heat dissipation portion 10 also rises above the normal rising temperature T1 of the semiconductor 2. In the heat dissipation structure 1, when the temperature of the heat dissipation portion 10 reaches the heat storage temperature T2, the heat storage portion 20 stores the heat of the semiconductor 2 through the heat dissipation portion 10 (see FIG. 3).

Thus, the heat dissipation structure 1 can suppress the temperature T of the semiconductor 2 to be the heat storage temperature T2 or less even though the current I having the large current value Ib flows to the semiconductor 2, and can thus make the temperature T of the semiconductor 2 lower than the failure temperature T3. In the heat dissipation structure 1, when the current I flowing to the semiconductor 2 returns to the current I having the normal current value Ia (time t3) after the current I having the large current value Ib flows to the semiconductor 2, the heat stored in the heat storage portion 20 is transferred to the heat dissipation portion 10, and the heat transferred to the heat dissipation portion 10 is dissipated. Thus, the heat dissipation structure 1 can return the temperature T of the semiconductor 2 to the normal rising temperature T1 of the semiconductor 2. Note that a temperature Ta denoted by a broken line in FIG. 4 indicates a temperature rise when the heat of the semiconductor 2 is not stored by the heat storage portion 20, and exceeds the failure temperature T3 of the semiconductor 2.

As described above, the heat dissipation structure 1 according to the first embodiment includes the heat dissipation portion 10 and the heat storage portion 20. The heat dissipation portion 10 has the heat receiving surface 11*a* including the contact surface 11*b* in contact with the semiconductor 2 generating the heat, and dissipates the heat of the semiconductor 2 in contact with the contact surface 11*b*. The heat storage portion 20 is arranged to sandwich the semiconductor 2. The heat storage portion 20 has, for example, the heat storage opening portion 23 in which the semiconductor 2 is positioned, and surrounds the semiconductor 2. The heat storage portion 20 is provided to be in contact with the heat receiving surface 11*a*, and stores the heat of the semiconductor 2 conducted through the heat dissipation portion 10.

With this configuration, the heat dissipation structure 1 can store the heat generated in the semiconductor 2 when the current I having the large current value Ib flows to the semiconductor 2, in the heat storage portion 20 through the heat dissipation portion 10. The heat dissipation structure 1 can dissipate the heat stored in the heat storage portion 20 through the heat dissipation portion 10. Thus, the heat dissipation structure 1 can appropriately dissipate the heat even when the current I having the large current value Ib flows to the semiconductor 2. In the heat dissipation structure 1, the abutting surface 22 of the heat storage portion 20 and the heat receiving surface 11*a* of the heat dissipation portion 10 are in contact with each other over a wide area, and the heat can thus be efficiently transferred between the heat dissipation portion 10 and the heat storage portion 20. The heat dissipation structure 1 can be miniaturized by using the heat storage portion 20 as compared with a case of dissipating the heat without using the heat storage portion 20. In the heat dissipation structure 1, deterioration of performance of the heat dissipation portion 10 can be suppressed as compared with a structure in which the heat storage body is embedded in the body of the cooling body as in the related art. As a result, the heat dissipation structure 1 can appropriately dissipate the heat of the semiconductor 2.

First Modification of First Embodiment

Figure 5:
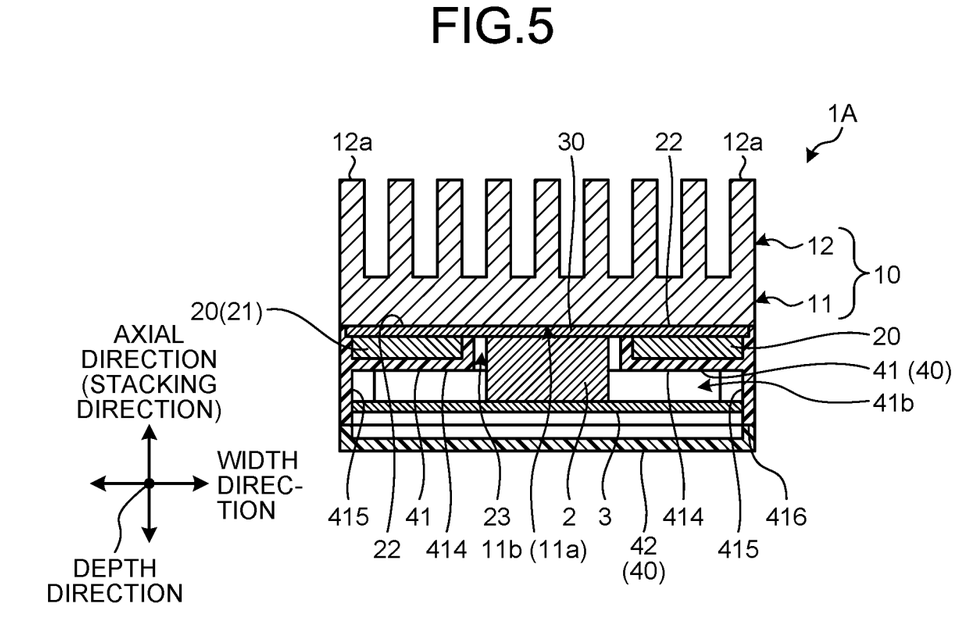
FIG. 5 is a cross-sectional view illustrating a configuration example of a heat dissipation structure according to a first modification of the first embodiment.
Figure 6:
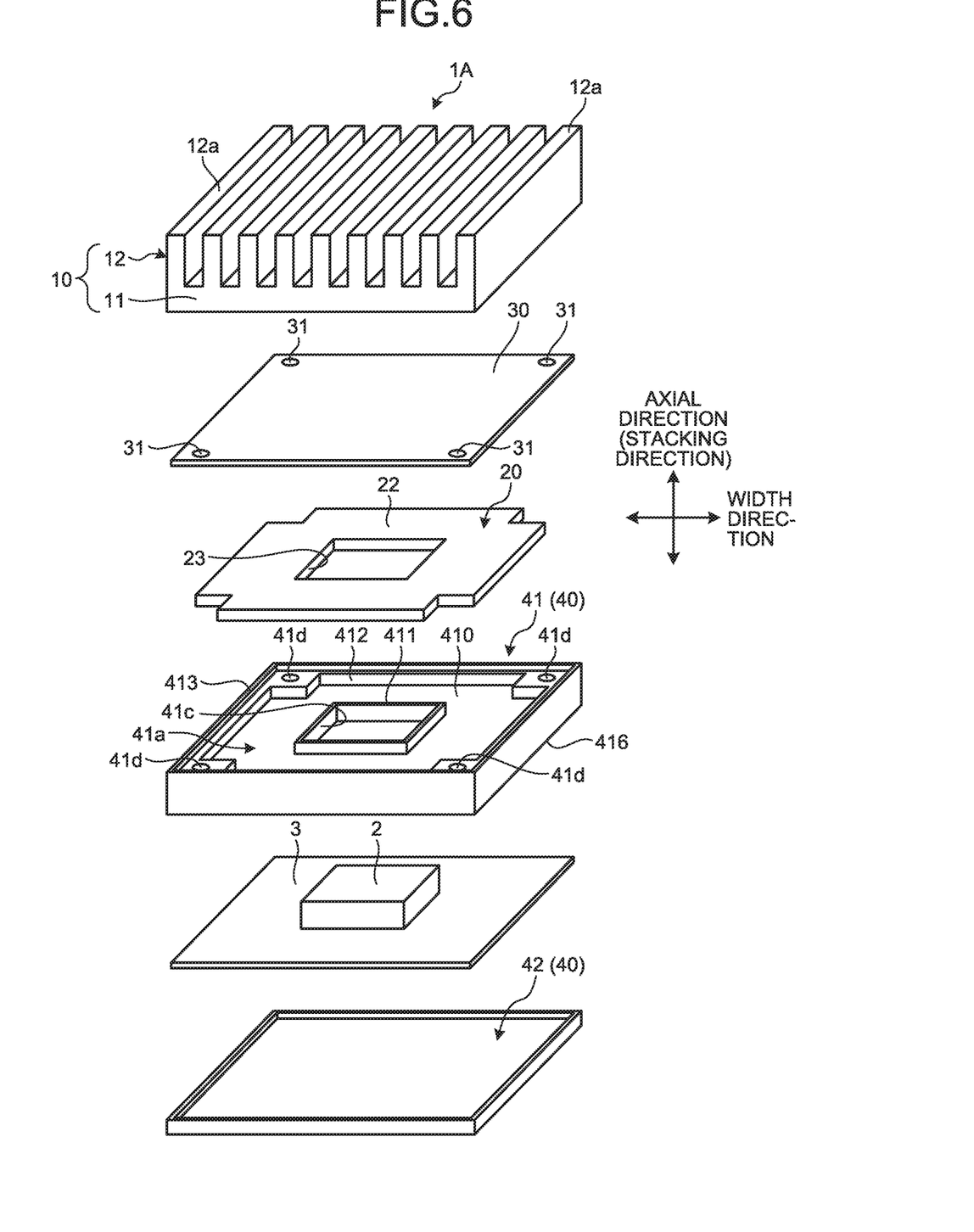
FIG. 6 is an exploded perspective view illustrating the configuration example of the heat dissipation structure according to the first modification of the first embodiment.

Next, a first modification of the first embodiment will be described. Note that, in a first modification of the first embodiment, the same components to those in the first embodiment are denoted by the same reference numerals and a detailed description thereof is omitted. F1G. 5 is a cross-sectional view illustrating a configuration example of a heat dissipation structure 1A according to a first modification of the first embodiment. FIG. 6 is an exploded perspective view illustrating the configuration example of the heat dissipation structure 1A according to the first modification of the first embodiment. The heat dissipation structure 1A according to the first modification is different from the heat dissipation structure 1 according to the first embodiment in that it includes a heat conductive sheet 30.

The heat dissipation structure 1A according to the first modification includes a heat dissipation portion 10, a heat storage portion 20, the heat conductive sheet 30 as a thermal interface material (heat conductive member), and a housing 40, as illustrated in FIGS. 5 and 6. The heat conductive sheet 30 is a member having a thermal conductivity higher than that of the heat dissipation portion 10. The heat conductive sheet 30 is formed in a thin film shape or a thin plate shape, and is, for example, a graphite sheet, but is not limited thereto. The heat conductive sheet 30 is formed in the same size as that of a heat receiving surface 11*a* of a heat sink 11. The heat conductive sheet 30 is provided between the heat receiving surface 11*a* of the heat sink 11, and a semiconductor 2 and the heat storage portion 20. In other words, the heat conductive sheet 30 is interposed between the heat receiving surface 11*a* of the heat sink 11, and the semiconductor 2 and the heat storage portion 20 in a state where one surface thereof in a stacking direction is in contact with the heat receiving surface 11*a* of the heat sink 11 and the other surface thereof in the stacking direction is in contact with the semiconductor 2 and the heat storage portion 20. For example, when a current I having a large current value Ib flows to the semiconductor 2, the heat conductive sheet 30 can transfer heat of the semiconductor 2 to the heat storage portion 20 at a speed faster than that in the heat dissipation portion 10, and can thus improve a heat storage effect.

The housing 40 accommodates various components. The housing 40 is formed of a material such as resin or metal. The housing 40 includes a case 41 and a cover 42. The case 41 has a rectangular outer shape as illustrated in FIG. 6, and includes a first accommodating portion 41a, a second accommodating portion 41b (see FIG. 5), and a case opening portion 41c as a housing opening portion. The first accommodating portion 41a is provided on a side facing the heat dissipation portion 10 in an axial direction, and is opened on the side facing the heat dissipation portion 10. An inner side of the first accommodating portion 41a is formed according to a shape of the heat storage portion 20.

The first accommodating portion 41a has a bottom surface portion 410, an inner wall portion 411, and an outer wall portion 412. The bottom surface portion 410 is a surface portion provided on an opposite side to an opening edge 413 of the first accommodating portion 41a in the axial direction, and supports the heat storage portion 20. The inner wall portion 411 is provided along an edge portion of the case opening portion 41c, and is erected along the axial direction. The outer wall portion 412 defines an outer shape of the first accommodating portion 41a, and is erected along the axial direction. The first accommodating portion 41a is formed to be surrounded by the bottom surface portion 410, the inner wall portion 411, and the outer wall portion 412.

The heat storage portion 20 is assembled from one side (side facing the heat dissipation portion 10) in the axial direction to the first accommodating portion 41a, and the first accommodating portion 41a accommodates the heat storage portion 20. The case 41 defines a position of the heat storage portion 20 by the outer wall portion 412 in a state where the heat storage portion 20 is accommodated in the first accommodating portion 41a. The case 41 is assembled to the heat receiving surface 11a of the heat dissipation portion 10 through the heat conductive sheet 30 in a state where the case 41 accommodates the heat storage portion 20 and defines the position of the heat storage portion 20. The case 41 includes hole portions 41d provided at four corner portions, and the heat conductive sheet 30 includes hole portions 31 provided at four corner portions. Bolts (not illustrated) are inserted into the hole portions 41d and 31 in the case 41 and the heat conductive sheet 30, and the case 41 and the heat conductive sheet 30 are assembled to the heat receiving surface 11a of the heat dissipation portion 10 by the inserted bolts.

The second accommodating portion 41b is provided on an opposite side to the heat dissipation portion 10 in the axial direction, as illustrated in FIG. 5, and is opened on the opposite side to the heat dissipation portion 10. An inner side of the second accommodating portion 41b is formed according to a shape of a substrate 3 of the semiconductor 2.

The second accommodating portion 41b has a bottom surface portion 414 and an outer wall portion 415. The bottom surface portion 414 is a surface portion provided on an opposite side to an opening edge 416 of the second accommodating portion 41b in the axial direction. The outer wall portion 415 defines an outer shape of the second accommodating portion 41b, and is erected along the axial direction. The second accommodating portion 41b is formed to be surrounded by the bottom surface portion 414 and the outer wall portion 415.

The semiconductor 2 and the substrate 3 are assembled from the other side (opposite side to the heat dissipation portion 10) in the axial direction to the second accommodating portion 41b, and the second accommodating portion 41b accommodates the semiconductor 2 and the substrate 3. At this time, in the case 41, the semiconductor 2 is inserted into the case opening portion 41c. The case 41 defines positions of the semiconductor 2 and the substrate 3 by the outer wall portion 415 in a state where the semiconductor 2 and the substrate 3 are accommodated in the second accommodating portion 41b. The opening edge 416 is covered with the cover 42 in a state where the case 41 accommodates the semiconductor 2 and the substrate 3 and defines the positions of the semiconductor 2 and the substrate 3.

The case opening portion 41c is an opening provided in a body of the case 41. The case opening portion 41c is formed in a rectangular shape according to a shape of the semiconductor 2. The case opening portion 41c is formed in the same size as that of a neat storage opening portion 23, and is positioned inside the heat storage opening portion 23 in the axial direction. The semiconductor 2 is inserted from an opposite side to the neat dissipation portion 10 in the axial direction into the case opening portion 41c, and the inserted semiconductor 2 is positioned inside the case opening portion 41c.

The cover 42 covers the opening edge 416 of the second accommodating portion 41b. The cover 42 is formed in a rectangular shape, and covers the opening edge 416 of the second accommodating portion 41b and closes the opening edge 416 in a state where the semiconductor 2 and the substrate 3 are accommodated in the second accommodating portion 41b.

As described above, the heat dissipation structure 1A according to the first modification of the first embodiment includes the heat conductive member provided between the semiconductor 2 and the heat storage portion 20, and the heat receiving surface 11a of the heat dissipation portion 10. The heat conductive member is, for example, the heat conductive sheet 30 having the thermal conductivity higher than that of the heat dissipation portion 10. With this configuration, in the heat dissipation structure 1A, when the current I having the large current value Ib flows to the semiconductor 2, it is possible to transfer the heat of the semiconductor 2 to the heat storage portion 20 at the speed faster than that in the neat dissipation portion 10, and it is thus possible to improve the heat storage effect.

The heat dissipation structure 1A includes the housing 40. The heat storage portion 20 is assembled from one side in the axial direction to the housing 40, the semiconductor 2 is assembled from the other side in the axial direction to the housing 40, and the housing 40 accommodates the heat storage portion 20 and the semiconductor 2. The housing 40 includes the case opening portion 41c which is positioned inside the heat storage opening portion 23 in the axial direction and into which the semiconductor 2 is inserted. With this configuration, in the heat dissipation structure 1A, the housing 40 holding the heat storage portion 20 can also function as a housing holding the semiconductor 2 and the substrate 3. Thus, in the heat dissipation structure 1A, it is possible to improve assemblability by assembling these components to the housing 40 and then assembling the housing 40 to the heat dissipation portion 10. In addition, in the heat dissipation structure 1A, it is possible to reduce the number of component housings by assembling various components to the housing 40.

Second Modification of First Embodiment

Figure 7:
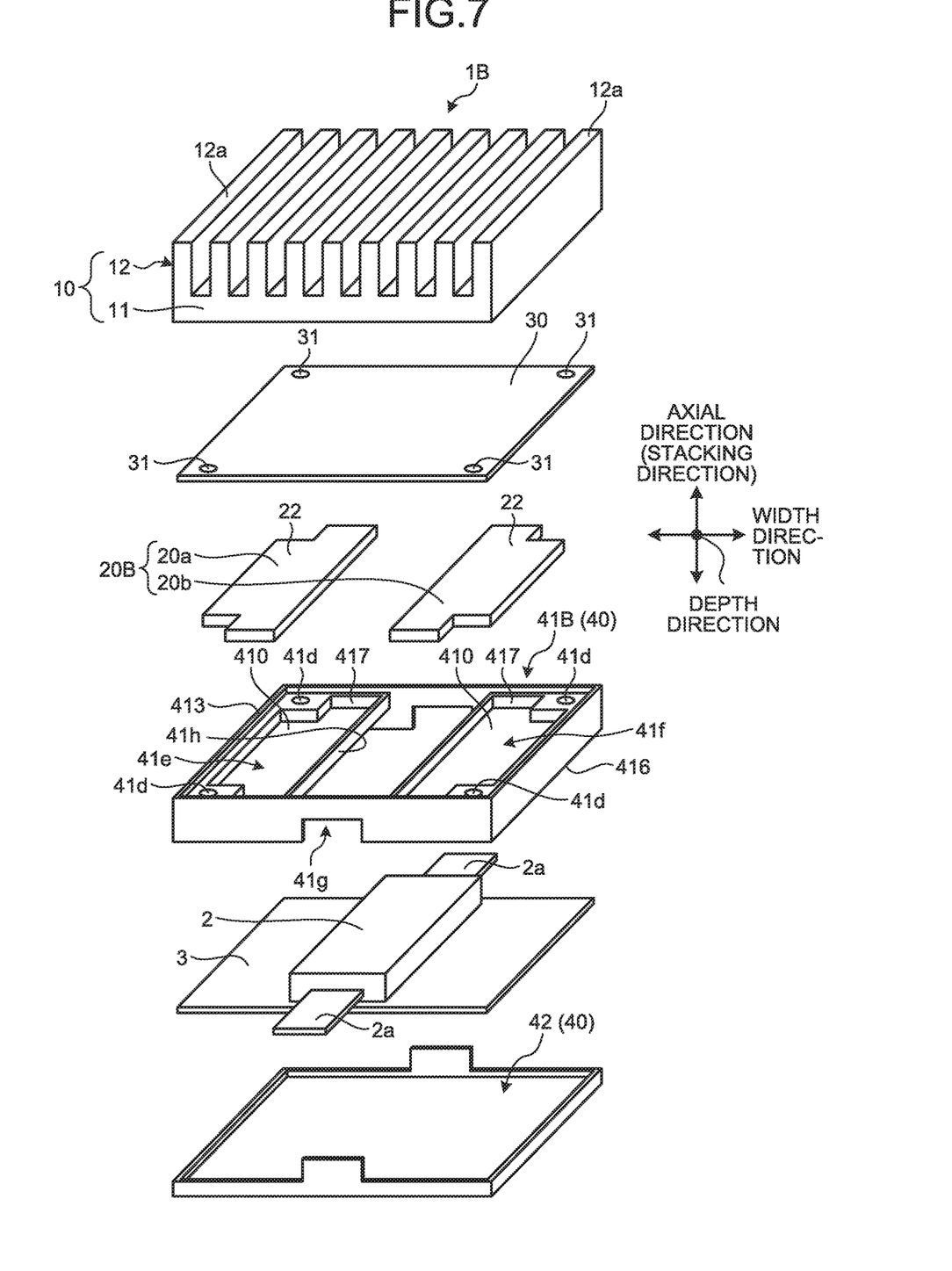
FIG. 7 is an exploded perspective view illustrating a configuration example of a heat dissipation structure according to a second modification of the first embodiment.

Next, a second modification of the first embodiment will be described. Note that, in a second modification of the first embodiment, the same components as those in the first embodiment are denoted by the same reference numerals and a detailed description thereof is omitted. FIG. 7 is an exploded perspective view illustrating a configuration example of a heat dissipation structure 1B according to a second modification of the first embodiment. The heat dissipation structure 1B according to the second modification is different from the heat dissipation structure 2 according to the first embodiment in that a heat storage portion 20B is arranged to be divided into two parts.

The heat dissipation structure 1B according to the second modification includes a heat dissipation portion 10, the heat storage portion 20B, a heat conductive sheet 30, and a housing 40, as illustrated in FIG. 7. The heat storage portion 20B stores heat, and includes a first heat storage plate 20a and a second heat storage plate 20b. The first heat storage plate 20a and the second heat storage plate 20b are arranged side by side in a width direction, and are positioned with a semiconductor 2 interposed therebetween in the width direction.

The first heat storage plate 20a is positioned on one side of the semiconductor 2 in the width direction. A length of the first heat storage plate 20a in a depth direction is equal to that of the semiconductor 2 in the depth direction. An abutting surface 22 of the first heat storage plate 20a is provided on a side facing the heat dissipation portion 10 in a stacking direction, and faces a heat receiving surface lie of the heat dissipation portion 10. The second heat storage plate 20b is positioned on the other side of the semiconductor 2 in the width direction. The second heat storage plate 20b is formed in the same shape as that of the first heat storage plate 20a, and a length of the second heat storage plate 20b in the depth direction is equal to that of the semiconductor 2 in the depth direction. An abutting surface 22 of the second heat storage plate 20b is provided on a side facing the heat dissipation portion 10 in the stacking direction, and faces the heat receiving surface 11a of the heat dissipation portion 10.

The heat storage portion 20B sandwiches the semiconductor 2 in a state where the semiconductor 2 is positioned between the first heat storage plate 20a and the second heat storage plate 20b in the width direction. The heat storage portion 20B has a certain interval from the semiconductor 2 in the width direction, and is positioned in a non-contact state with the semiconductor 2. The heat storage portion 20B is assembled to the heat dissipation portion 10 in a state of being accommodated and held in a case 41B.

The case 41B has a rectangular outer shape, and includes a first accommodating portion 41e, a second accommodating portion 41f, a third accommodating portion 41g, and a case opening portion 41h. The first accommodating portion 41e accommodates the first heat storage plate 20a. The first accommodating portion 41e is provided on a side facing the heat dissipation portion 10 in an axial direction, and an inside of the first accommodating portion 41e is formed according to a shape of the first heat storage plate 20a. The first accommodating portion 41e includes, for example, a bottom surface portion 410 and a wall portion 417. The bottom surface portion 410 is a portion that supports the first heat storage plate 20a. The wall portion 417 is formed along an outer shape of the first heat storage plate 20a, and is erected along the axial direction. The first accommodating portion 41e is formed to be surrounded by the bottom surface portion 410 and the wall portion 417.

The second accommodating portion 41f is formed in the same manner as the first accommodating portion 41e described above, and accommodates the second heat storage plate 20b. The second accommodating portion 41f is provided on the side facing the heat dissipation portion 10 in the axial direction, and an inside of the second accommodating portion 41f is formed according to a shape of the second heat storage plate 20b. The second accommodating portion 41f includes, for example, a bottom surface portion 410 and a wall portion 417. The bottom surface portion 410 is a portion that supports the second heat storage plate 20b. The wall portion 417 is formed along an outer shape of the second heat storage plate 20b, and is erected along the axial direction. The second accommodating portion 41f is formed to be surrounded by the bottom surface portion 410 and the wall portion 417.

The third accommodating portion 41g is provided on an opposite side to the heat dissipation portion 10 in the axial direction, and is opened on the opposite side to the heat dissipation portion 10. An inner side of the third accommodating portion 41g is formed according to a shape of a substrate 3 of the semiconductor 2.

The case opening portion 41h is an opening provided in a body of the case 41B. The case opening portion 41h is formed in a rectangular shape according to a shape of the semiconductor 2. The case opening port on 41h is positioned between the first accommodating portion 41e and the second accommodating portion 41f in the width direction. The semiconductor 2 is inserted from an opposite side to the heat dissipation portion 10 in the axial direction into the case opening portion 41h, and the inserted semiconductor 2 is positioned inside the case opening portion 41h. Note that the semiconductor 2 is provided with a current path 2a extending along the depth direction.

As described above, in the heat dissipation structure 1B according to the second modification of the first embodiment, the heat storage portion 20B is arranged to sandwich the semiconductor 2 from both sides along the width direction. The heat storage portion 20B includes, for example, the first heat storage plate 20a and the second heat storage plate 20b, and the first heat storage plate 20a and the second heat storage plate 20b are arranged side by side along the width direction and are positioned to sandwich the semiconductor 2 therebetween in the width direction. The heat storage portion 20B is provided on the heat receiving surface 11a of the heat dissipation portion 10 through the heat conductive sheet 30, and stores heat of the semiconductor 2 conducted from the heat dissipation portion 10. With this configuration, the heat dissipation structure 1B can appropriately dissipate the heat of the semiconductor 2.

Second Embodiment

Figure 8:
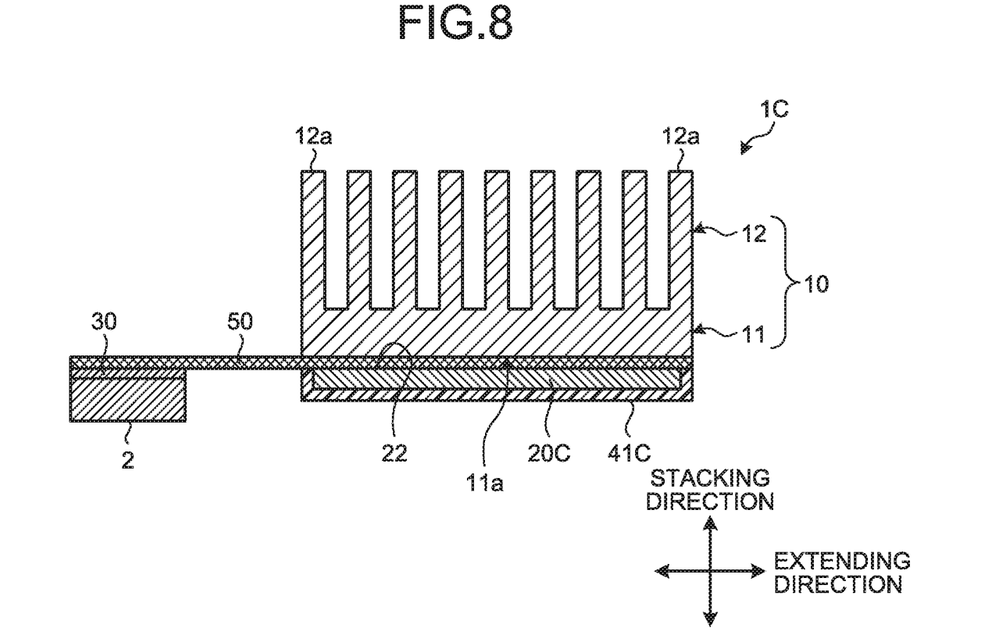
FIG. 8 is a cross-sectional view illustrating a configuration example of a heat dissipation structure according to a second embodiment.

Next, a heat dissipation structure 1C according to a second embodiment will be described. Note that, in a second embodiment, the same components as those in the first embodiment are denoted by the same reference numerals and a detailed description thereof is omitted. FIG. 8 is a cross-sectional view illustrating a configuration example of a heat dissipation structure 1C according to a second embodiment. The heat dissipation structure 1C according to the second embodiment is different from the heat dissipation structure 1 according to the first embodiment in that a semiconductor 2 and a heat dissipation portion 10 are connected to each other through a heat pipe 50.

The heat dissipation structure 1C according to the second embodiment includes the heat dissipation portion 10, a heat storage portion 20C, a heat conductive sheet 30, a case 41C, and the heat pipe 50 as a heat conductive member, as illustrated in FIG. 8. The semiconductor 2 is provided on one side of the heat pipe 50 in an extending direction of the heat pipe 50, and is positioned on an opposite side to a side of the heat pipe 50 facing the heat dissipation portion 10 in a stacking direction. The semiconductor 2 is connected to the heat pipe 50 through the heat conductive sheet 30.

The heat dissipation portion 10 is provided on the other side of the heat pipe 50 in the extending direction of the heat pipe 50, and is positioned on an opposite side to a side of the heat pipe 50 facing the semiconductor 2 in the stacking direction. In the heat dissipation portion 10, a heat receiving surface 11a is in contact with the heat pipe 50. The heat dissipation portion 10 dissipates heat of the semiconductor 2 conducted through the heat pipe 50. In addition, the heat dissipation portion 10 dissipates heat stored in the heat storage portion 20C.

The heat pipe 50 is formed in a long shape, the semiconductor 2 is provided on one side of the heat pipe 50 in the extending direction of the heat pipe 50, and the heat dissipation portion 10 is provided on the other side of the heat pipe 50 in the extending direction of the heat pipe 50, such that the heat pipe 50 connects the semiconductor 2 and the heat dissipation portion 10 to each other. The heat pipe 50 conducts the heat generated by the semiconductor 2 to the heat dissipation portion 10 and the heat storage portion 20C.

The heat storage portion 20C is provided on a side of the heat pipe 50 adjacent to the heat dissipation portion 10, and is positioned to face the heat dissipation portion 10 through the heat pipe 50. The heat storage portion 20C is formed a plate shape, and is formed in the same size as that of the heat receiving surface 11a of the heat dissipation portion 10 when viewed from the stacking direction. The heat storage portion 20C is assembled to the heat dissipation portion 10 through the heat pipe 50 in a state of being accommodated and held in the case 41C. The heat storage portion 20C stores the heat of the semiconductor 2 conducted through the heat pipe 50 by including an abutting surface 22 provided to be connected to the heat pipe 50. In addition, the heat storage portion 20C transfers the stored heat to the heat dissipation portion 10 through the heat pipe 50.

As described above, the heat dissipation structure 1C according to the second embodiment includes the heat dissipation portion 10, the heat pipe 50, and the heat storage portion 20C. The heat dissipation portion 10 is provided to be spaced apart from the semiconductor 2 generating the heat, and dissipates the heat generated by the semiconductor 2. The heat pipe 50 connects the semiconductor 2 and the heat dissipation portion 10 to each other, and conducts the heat generated by the semiconductor 2 to the heat dissipation portion 10. The heat storage portion 20C provided on a side adjacent to the heat dissipation portion 10, and stores the heat generated by the semiconductor 2. With this configuration, the heat dissipation structure 1C can efficiently transfer the heat of the semiconductor 2 to the heat dissipation portion 10 and the heat storage portion 20C by soaking the heat of the semiconductor 2 by the heat pipe 50. As a result, the heat dissipation structure 1C can appropriately dissipate the heat of the semiconductor 2.

In the heat dissipation structure 1C described above, the heat storage portion 20C is provided on a side adjacent to the heat dissipation portion 10, and is positioned to face the heat dissipation portion 10 through the heat pipe 50. With this configuration, the heat dissipation structure 1C can efficiently transfer the heat of the semiconductor 2 to the heat dissipation portion 10 and the heat storage portion 20C through the heat pipe 50. In addition, the heat dissipation structure 1C can efficiently transfer the heat stored in the heat storage portion 20C to the heat dissipation portion 10 through the heat pipe 50.

Modification of Second Embodiment

Figure 9:
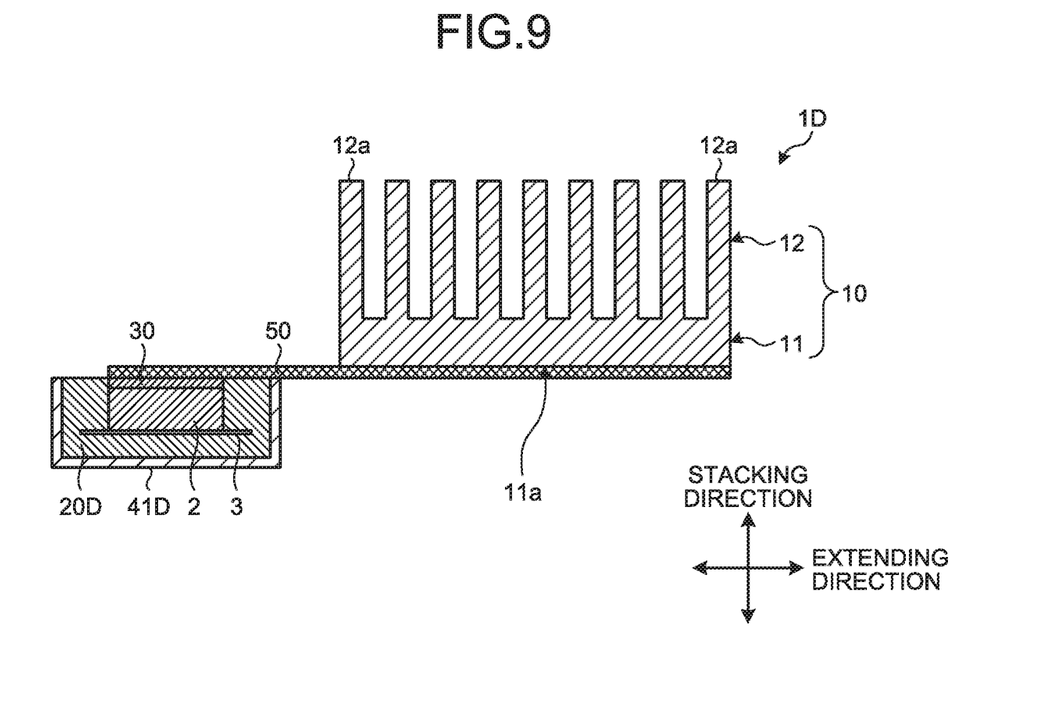
FIG. 9 is a cross-sectional view illustrating a configuration example of a heat dissipation structure according to a modification of the second embodiment.

Next, a heat dissipation structure 1D according to a modification of the second embodiment will be described. Note that, in a modification of the second embodiment, the same components as those in the second embodiment are denoted by the same reference numerals and a detailed description thereof is omitted. FIG. 9 is a cross-sectional view illustrating a configuration example of a heat dissipation structure 1D according to a modification of the second embodiment. The heat dissipation structure 1D according to the modification is different from the heat dissipation structure 1C according to the second embodiment in that a heat storage portion 20D is provided on a side adjacent to a semiconductor 2.

The heat dissipation structure 1D according to the modification of the second embodiment includes a heat dissipation portion 10, a heat storage portion 20D, a heat conductive sheet 30, a case 41D, and a heat pipe 50, as illustrated in FIG. 9.

The heat storage portion 20D is provided on the side adjacent to the semiconductor 2 in an extending direction of the heat pipe 50, and is positioned to be in contact with the semiconductor 2. In the heat storage portion 20D, for example, a solid--liquid phase change material is enclosed in a small capsule, and a gel-like resin including the small capsule is formed. The heat storage portion 20D is formed by filling the gel-like resin including the small capsule inside the case 41D and solidifying the resin in a state where the semiconductor 2 is positioned inside the case 41D. Thus, the heat storage portion 20D solidified inside the case 41D is in contact with the semiconductor 2 in a state of covering the surrounding of the semiconductor 2. In other words, the semiconductor 2 is embedded in the heat storage portion 20D solidified inside the case 41D.

As described above, in the heat dissipation structure 1D according to the modification of the second embodiment, the heat storage portion 20D is provided on the side adjacent to the semiconductor 2, and is positioned to be in contact with the semiconductor 2. With this configuration, the heat dissipation structure 1D can efficiently store heat of the semiconductor 2 in the heat storage portion 20D. In addition, in the heat dissipation structure 1D, the heat of the semiconductor 2 is stored directly in the heat storage portion 20D, and it is thus possible to simplify a structure of heat transport by the heat pipe 50. The heat dissipation structure 1D can transfer the heat of the semiconductor 2 stored in the heat storage portion 20D to the heat dissipation portion 10 through the heat pipe 50, and can thus efficiently dissipate the heat stored in the heat storage portion 20D.

Note that an example in which the heat conductive sheet 30 is, for example, the graphite sheet has been described hereinabove, but the heat conductive sheet 30 is not limited thereto, and may be another member as long as a thermal conductivity of another member is higher than that of the heat dissipation portion 10.

An example in which the heat storage portion 20 is assembled from one side in the axial direction to the housing 40 and the semiconductor 2 is assembled from the other side in the axial direction to the housing 40 has been described above, but the housing 40 is not limited thereto, and may be assembled by another assembling method.

An example in which the housing 40 has the case opening portion 41c or 41h has been described, but the housing 40 is not limited thereto, and may not have the case opening portion 41c or 41h.

An example in which the thermal interface material (heat conductive member) is configured to include the heat conductive sheet 30 has been described, but the thermal interface material is not limited thereto, and may be another configuration. The thermal interface material (heat conductive member) may be configured to include, for example, grease for increasing a degree of adhesion, a heat dissipation sheet for heat dissipation, or the like. That is, the thermal interface material (heat conductive member) is configured to include at least one of the heat conductive sheet 30, the heat dissipation sheet, and the grease.

The heat dissipation structure according to the embodiment can appropriately dissipate the heat of the electronic component by including the heat storage portion surrounding the electronic component. In addition, the heat dissipation structure according to the embodiment includes the heat conductive member that connects the electronic component and the heat dissipation portion to each other and the heat storage portion provided on any one of the side adjacent to the heat dissipation portion and the side adjacent to the electronic component, and can thus appropriately dissipate the heat of the electronic component.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A heat dissipation structure comprising:
a heat dissipation portion that has a heat receiving surface including a contact surface in contact with an electronic component generating heat and dissipates the heat of the electronic component in contact with the contact surface;
a heat storage portion that is arranged to sandwich the electronic component, is provided to be in contact with the heat receiving surface, and stores the heat of the electronic component conducted through the heat dissipation portion; and
a housing that accommodates the heat storage portion and the electronic component, wherein
the heat storage portion has a heat storage opening portion in which the electronic component is positioned and surrounds the electronic component in a state where the electronic component is positioned in the heat storage opening portion,
the heat storage portion is assembled from one side in an axial direction of the heat storage opening portion to the housing and the electronic component is assembled from the other side in the axial direction to the housing, and
the housing includes a housing opening portion which is positioned inside the heat storage opening portion in the axial direction and into which the electronic component is inserted.

2. A heat dissipation structure comprising:
a heat dissipation portion that has a heat receiving surface including a contact surface facing to an electronic component generating heat and dissipates the heat of the electronic component facing to the contact surface;
a heat storage portion that is arranged to sandwich the electronic component, is provided to be facing to the heat receiving surface, and stores the heat of the electronic component conducted through the heat dissipation portion; and
a heat conductive member that is provided between the heat receiving surface and each of the electronic component and the heat storage portion and the heat conductive member is in contact with each of the heat receiving surface, the electronic component and the heat storage portion, wherein
the heat storage portion includes a heat storage opening and the electronic component is positioned in and surrounded by the opening.

3. The heat dissipation structure according to claim 2, further comprising:
a housing that accommodates the heat storage portion and the electronic component, wherein
the heat storage portion is assembled from one side in an axial direction of the heat storage opening portion to the housing and the electronic component is assembled from the other side in the axial direction to the housing, and
the housing includes a housing opening portion which is positioned inside the heat storage opening portion in the axial direction and into which the electronic component is inserted.

4. The heat dissipation structure according to claim 1, wherein the heat storage portion includes a solid-liquid phase-change material.

* * * * *